United States Patent
Cheng et al.

(10) Patent No.: US 7,701,287 B2
(45) Date of Patent: Apr. 20, 2010

(54) VOLTAGE DETECTION TYPE OVERCURRENT PROTECTION DEVICE FOR CLASS-D AMPLIFIER

(75) Inventors: Chi-Chen Cheng, Taipei (TW); Chih-Ying Huang, Taipei (TW)

(73) Assignee: C-Media Electronics Inc., Taipei (TW)

( * ) Notice: Subject to any disclaimer, the term of this patent is extended or adjusted under 35 U.S.C. 154(b) by 84 days.

(21) Appl. No.: 12/137,701

(22) Filed: Jun. 12, 2008

(65) Prior Publication Data
US 2009/0153251 A1  Jun. 18, 2009

(30) Foreign Application Priority Data
Dec. 14, 2007  (TW)  .............................. 96148008 A

(51) Int. Cl.
*H03F 3/217*  (2006.01)
*H03F 1/52*  (2006.01)
(52) U.S. Cl. ...................................... 330/251; 330/298

(58) Field of Classification Search .................... 330/10, 330/207 A, 207 P, 251, 298
See application file for complete search history.

(56) References Cited

U.S. PATENT DOCUMENTS

| 5,886,586 A * | 3/1999 | Lai et al. ..................... 332/109 |
| 7,327,187 B2 * | 2/2008 | Lee .............................. 330/10 |

* cited by examiner

Primary Examiner—Steven J Mottola
(74) Attorney, Agent, or Firm—Ming Chow Sinorica, LLC

(57) ABSTRACT

The present invention discloses a voltage detection type overcurrent protection device, which applies to the output stage of a CMOS Class-D audio amplifier. Generally, a Class-D audio amplifier is used to drive a high-load loudspeaker; therefore, it needs a high-current driver. When there is a short circuit in the load, the high current will burn out the driver stage. The present invention detects the output voltage to indirectly monitor whether the output current is too large. Once an overcurrent is detected, the output-stage transistor is turned off to stop high current lest the circuit be burned out.

5 Claims, 6 Drawing Sheets

US 7,701,287 B2

VOLTAGE DETECTION TYPE OVERCURRENT PROTECTION DEVICE FOR CLASS-D AMPLIFIER

BACKGROUND OF THE INVENTION

1. Field of the Invention

The present invention relates to an overcurrent protection device for a Class-D amplifier, particularly to a voltage detection type overcurrent protection device for a Class-D amplifier, which applies to a two-state output (1 or 0) high-power conversion efficiency Class-D amplifier or a general PWM system.

2. Description of the Related Art

Refer to FIG. 1. Generally, a Class-D amplifier adopts a current sensor to detect current, wherein a current mirror 12 copies an output current to another circuit by a very small proportion, and detects whether the copied current exceeds a threshold. Such a design usually at least needs an operational amplifier 16 and a current comparator 14. Therefore, when realized with an integrated circuit, the conventional current detection circuit is more complicated, less power-efficient and less space-efficient.

Refer to FIG. 2 for a conventional CMOS (Complementary Metal Oxide Semiconductor) Class-D amplifier. An audio signal is amplified by an audio amplifier 18 and then output to a comparator 20. The comparator 20 compares the amplified audio signal with a signal of a triangle generator 22 and outputs the result to a clock logic module 24. CMOS transistors 26 succeed to the clock logic module 24 and function as the output stage. The output terminals of the CMOS transistors 26 are connected to a filter circuit containing inductors 28 and capacitors 30, and the filter circuit is then connected to a loudspeaker 32.

A Taiwan patent No. 560125 disclosed a "Current Detection and Overcurrent Protection Circuit for Transistors of PWM Amplifier". The Claim 4 of the prior-art patent disclosed an overcurrent protection circuit for a switching circuit, which uses at least one switching transistor P1 to provide a given load current IL for a load and which comprises: a sampling/holding capacitor C2, a switch 31, an overcurrent detection device 50, and a controller 60. The sampling/holding capacitor C2 is used to temporarily hold a terminal voltage VP1 of the turned on switching transistor P1. The switch 31 is arranged in between the switching transistor P1 and the sampling/holding capacitor C2, and is turned on synchronously with the switching transistor P1. The overcurrent detection device 50 is used to determine whether a detected voltage VS1, which is corresponding to a voltage charging the sampling/holding capacitor C2, exceeds a predetermined reference voltage VREF. When the detected voltage VS1 is over the reference voltage VREF, the controller compulsorily turns off the switching transistor P1. From the above description, it is known that the prior-art overcurrent protection circuit uses the sampling/holding capacitor to detect overcurrent.

Contrasting to the prior art, the present invention proposes a voltage detection type overcurrent protection device to detect overcurrent.

SUMMARY OF THE INVENTION

The primary objective of the present invention is to provide a voltage detection type overcurrent protection device for a Class-D amplifier, which is used to perform overcurrent protection for a rear-stage high-current driver.

Another objective of the present invention is to provide a voltage detection type overcurrent protection device for a Class-D amplifier, which can be realized with an integrated circuit more simply and space-efficiently and will operate more power-efficiently.

The present invention proposes a voltage detection type overcurrent protection device for a Class-D amplifier, which is used to perform overcurrent protection for a rear-stage high-current driver. A driver stage usually comprises large-area PMOS and NMOS so that it can provide sufficient current for a high-load loudspeaker. As a Class-D amplifier outputs digital PWM signal of 0 and 1, the PMOS (P-channel MOS) transistors and NMOS (N-channel MOS) transistors in the output stage thereof output on-off or off-on signals.

Below, the embodiments of the present invention are described in detail in cooperation with the attached drawings to make easily understood the objectives, technical contents, characteristics and accomplishments of the present invention.

DETAILED DESCRIPTION OF THE INVENTION

Figure 1:
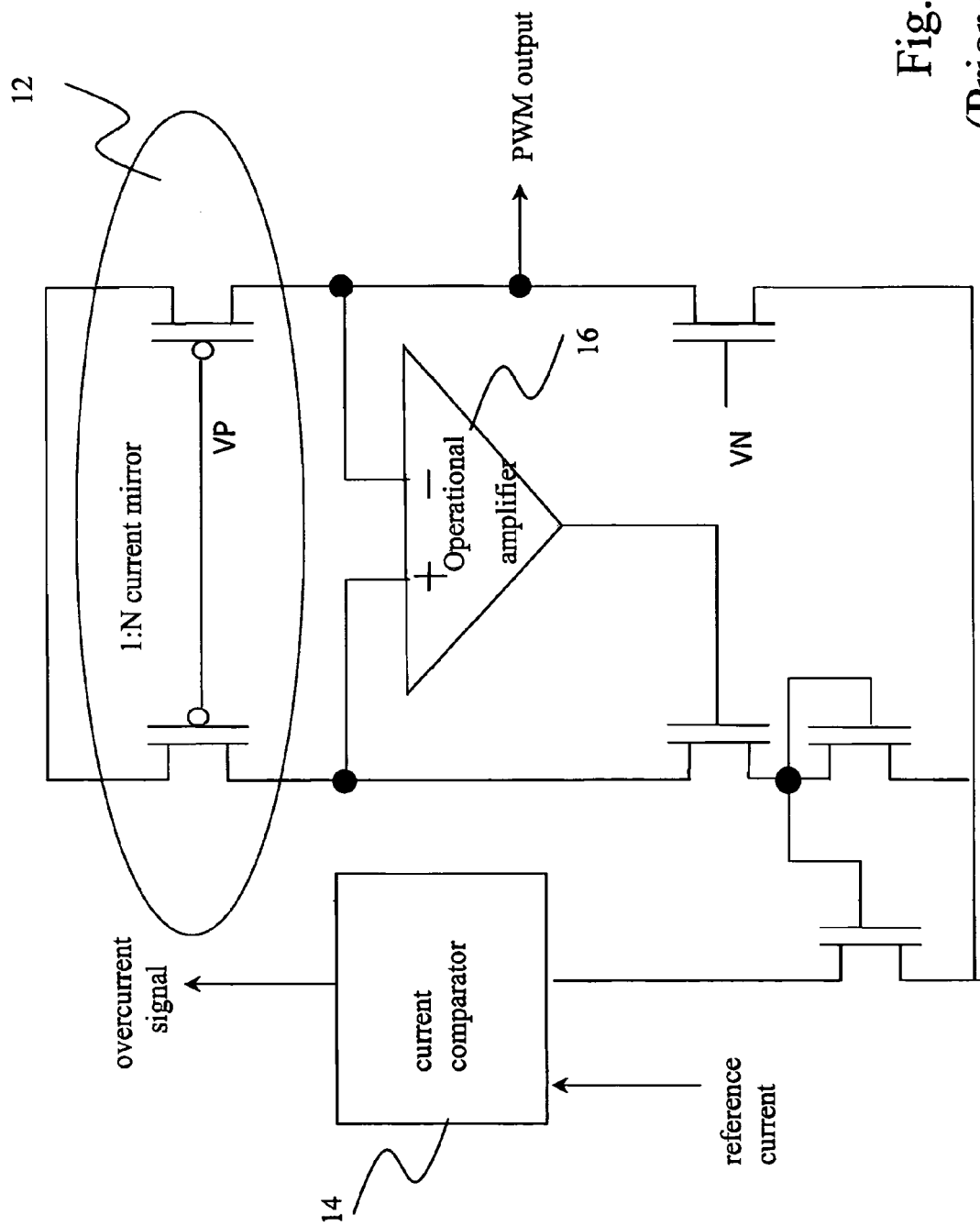
FIG. 1 is a diagram showing a prior-art circuit.
Figure 2:
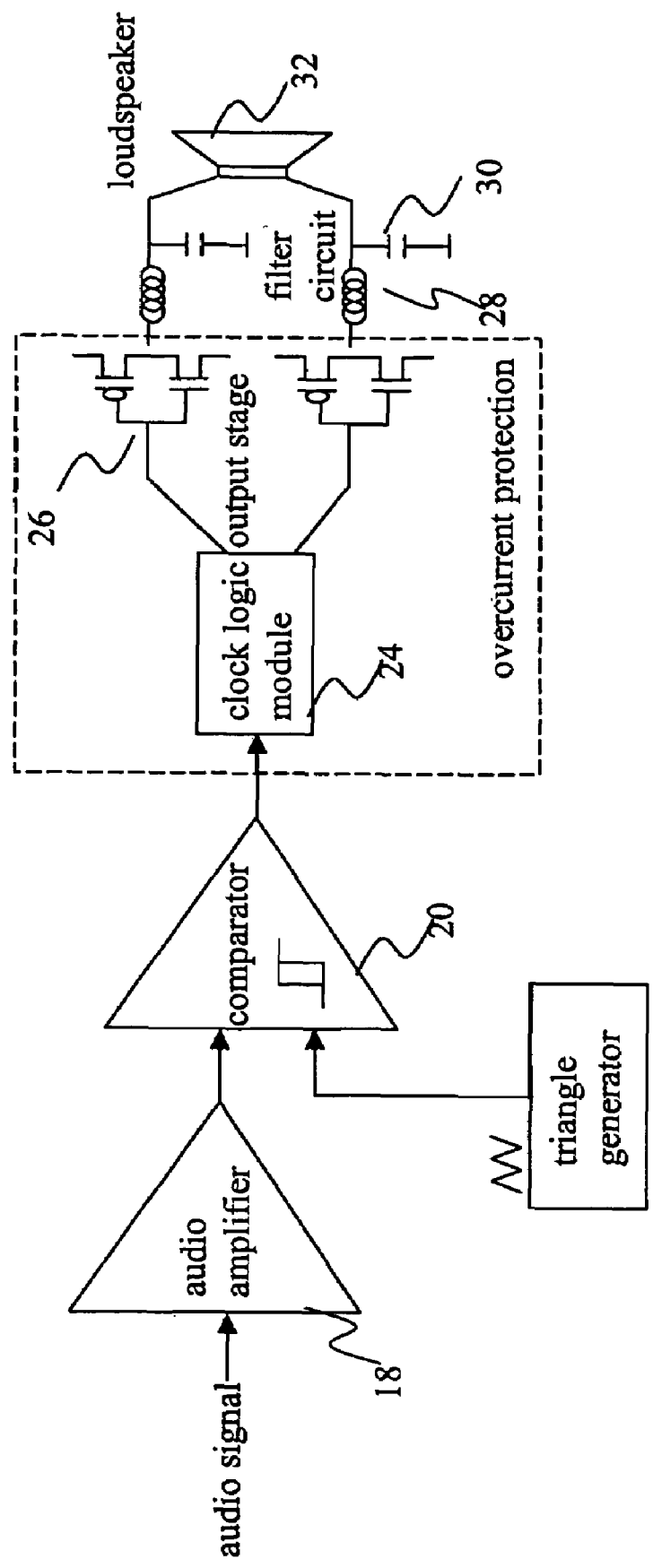
FIG. 2 is a block diagram of conventional class D amplifier.
Figure 3:
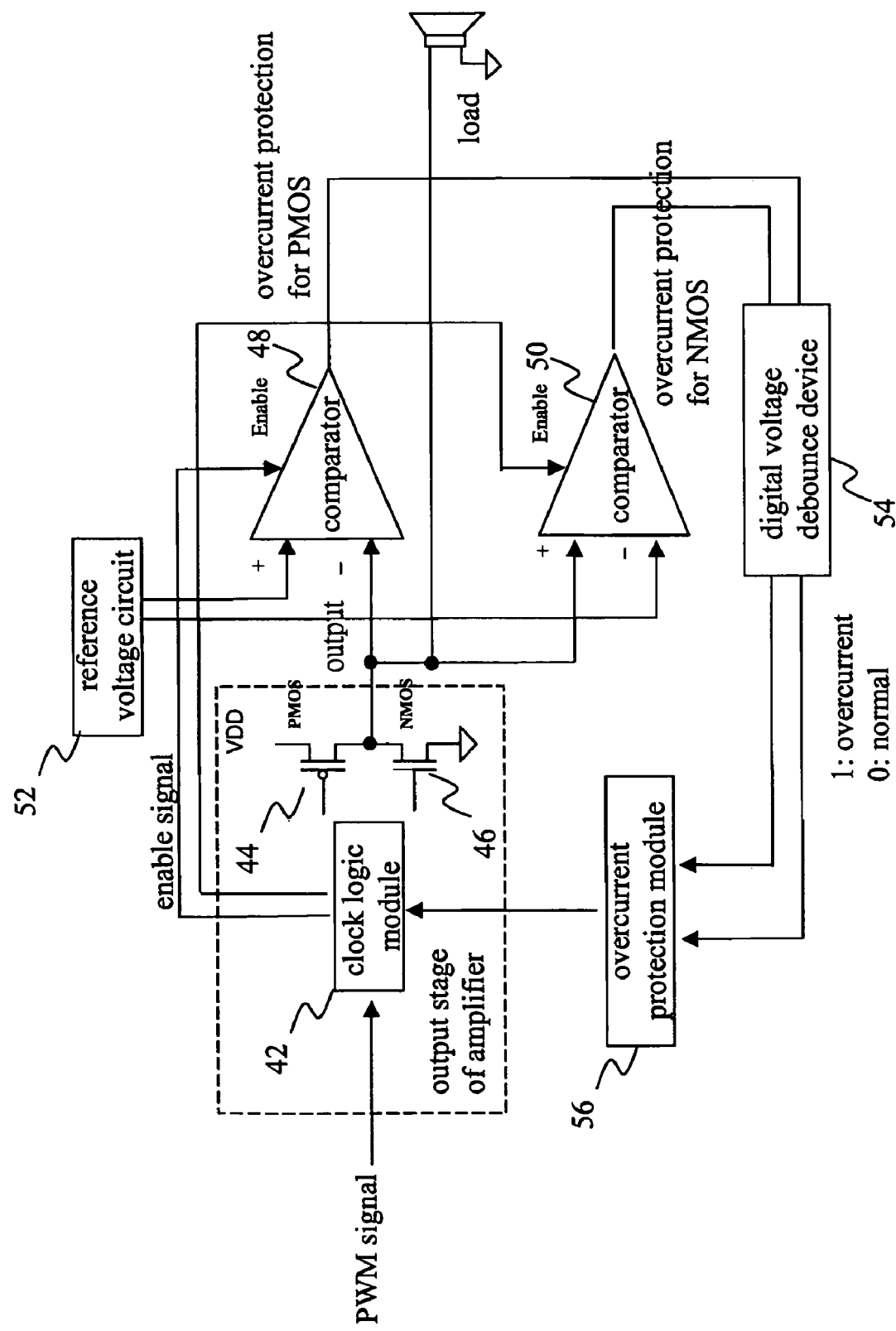
FIG. 3 is a diagram schematically showing a circuit according to the present invention.

Refer to FIG. 3 for an output stage of a Class-D amplifier. Firstly, an audio signal is converted into a PWM signal (the output of a Class-D amplifier). Next, a clock logic module 42 converts the PWM signal into non-overlap clock signals, which control the output-stage CMOS transistors 44 and 46 to function as switches and drive a load, such as a loudspeaker. The CMOS transistors include a PMOS transistor 44 and a NMOS transistor 46, and the gates of the PMOS transistor 44 and NMOS transistor 46 are connected to the clock logic module 42. In FIG. 3, VDD denotes the voltage of the power source. The output terminals of the CMOS transistors are respectively connected to a first voltage comparator 48 and a second voltage comparator 50.

A reference voltage circuit 52 is connected to the first voltage comparator 48 and the second voltage comparator 50. According the preset values of the short-circuit current, the reference voltage circuit 52 provides two different reference voltages for the first voltage comparator 48 and the second voltage comparator 50. The input terminals of a digital voltage debounce device 54 are respectively connected to the output terminals of the first voltage comparator 48 and the second voltage comparator 50. The input terminals of an overcurrent protection module 56 are connected to the digital voltage debounce device 54, and the output terminal of the overcurrent protection module 56 is connected to the clock logic module 42.

When there is an overcurrent occurring, it means that the output has a very small resistance with respect to the power source or the ground, and that the output voltage is greatly dragged upward or downward. At this time, the output voltage is no more the ideal VDD or 0 but between VDD and 0. Below is derived the relationship between the output current and the output voltage.

Figure 4:
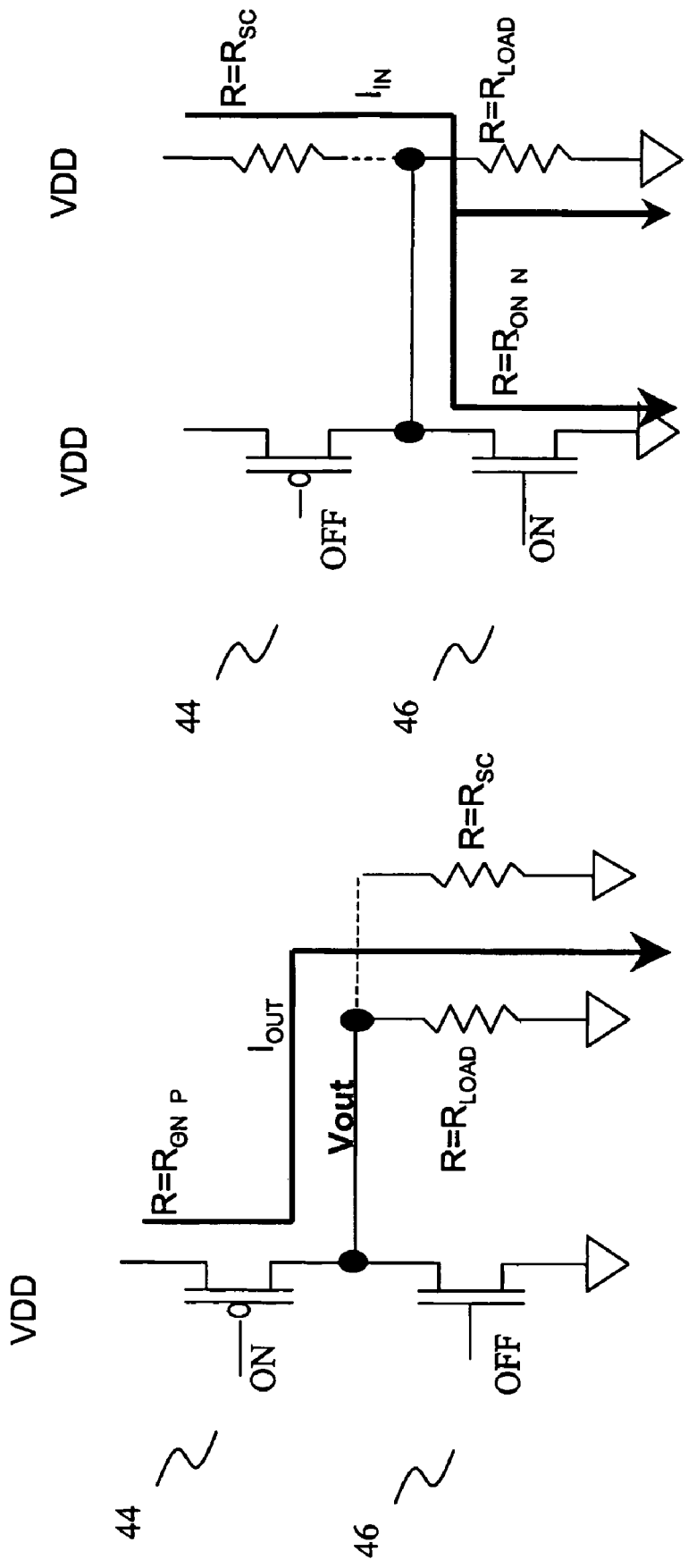
FIG. 4 is a diagram schematically showing overcurrents in a circuit according to the present invention.

Refer to FIG. 4. Suppose VDD denotes the voltage of the power source, $R_{ON\_P}$ the turn-on resistance of the PMOS transistor, $R_{ON\_N}$ the turn-on resistance of the NMOS transistor, $R_{LOAD}$ the resistance of the external load, $R_{SC}$ the short-circuit resistance, $V_{OUT}$ the output voltage, $I_{OUT}$ the output current, and $I_{IN}$ the input current.

There are two cases to be discussed below.

Case I

In case I, the PMOS transistor 44 is turned on, and the NMOS transistor 46 is turned off, and $I_{OUT}=VDD/(R_{LOAD}+R_{ON\_P})$.

In a normal state, the short-circuit resistance $R_{SC}$ does not exist, and $R_{LOAD} \gg R_{ON\_P}$, and $V_{OUT}=VDD \times R_{LOAD}/(R_{LOAD}+R_{ON\_P}) \approx VDD$.

When there is an overcurrent occurring, $R_{SC} \approx 0$, and the parallel resistance of $R_{SC}$ and $R_{LOAD}$ is $R_{EQ}=(R_{SC}//R_{LOAD})$. Thus, $R_{EQ} \approx 0$, and $V_{OUT}=VDD \times R_{EQ}/(R_{EQ}+R_{ON\_P}) < VDD$. In other words, the smaller the short-circuit resistance $R_{SC}$, the smaller the output voltage $V_{OUT}$.

Case II

In case II, the PMOS transistor 44 is turned off, and the NMOS transistor 46 is turned on.

In a normal state, the short-circuit resistance $R_{SC}$ does not exist, and $V_{OUT}=0$.

When there is an overcurrent occurring, $R_{SC} \approx 0$, and the parallel resistance of $R_{ON\_N}$ and $R_{LOAD}$ is $R_N=R_{ON\_N}//R_{LOAD}$. Thus, $I_{IN}=VDD/(R_{SC}+R_N)$, and $V_{OUT}=VDD \times R_N/(R_N+R_{SC}) > 0$. In other words, the smaller the short-circuit resistance $R_{SC}$, the greater the output voltage $V_{OUT}$.

The short-circuit current can be calculated from the output voltage. Thus, the reference voltages of the first voltage comparator 48 and the second voltage comparator 50 can be calculated from the predetermined critical short-circuit currents. When the output of the first voltage comparator 48 or the second voltage comparator 50 has been 1 for a long time (>200 ns), the digital voltage debounce device 54 also outputs a signal of 1 to warn that there is an overcurrent. After receiving the warning, the overcurrent protection module 56 turns off the output-stage transistors 44 and 46 and stops high current lest the circuit be burned out.

Figure 5:
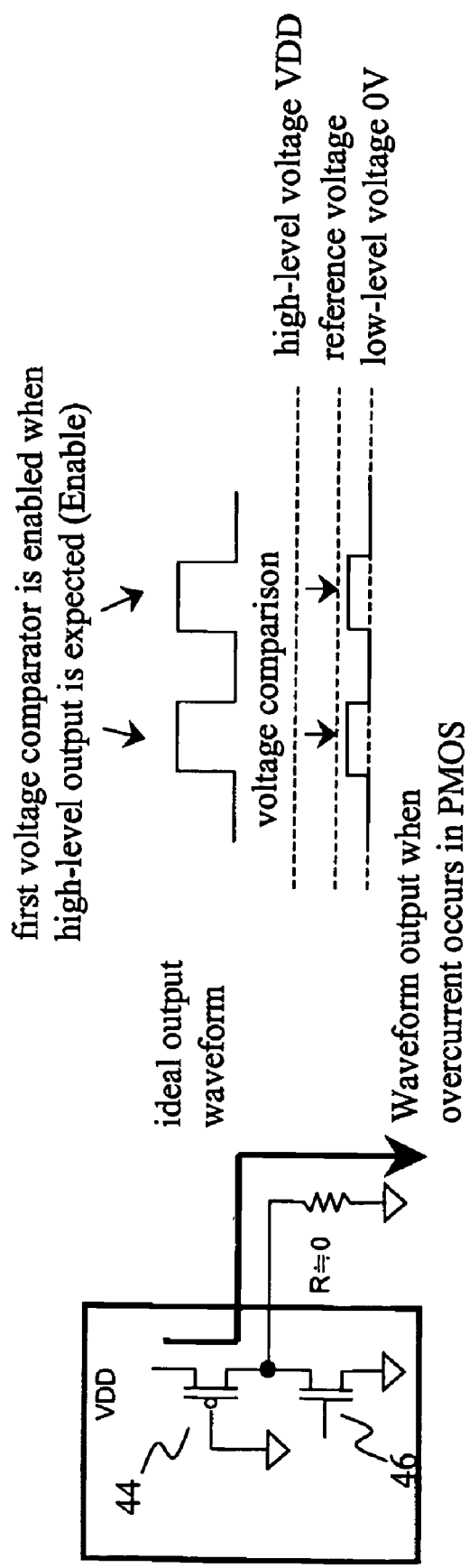
FIG. 5 is a diagram schematically showing that a first voltage comparator detects an overcurrent according to the present invention.

Refer to FIG. 5 for the overcurrent protection of the PMOS transistor 44. The clock logic module 42 can control the power amplifier to output 1 or 0. When CMOS driver output stage is expected to output 1, the first voltage comparator 48 begins to operate, and the clock logic module 42 sends an enable signal to the first voltage comparator 48. When CMOS driver output stage is expected to output 0, the first voltage comparator 48 will not operate. The first voltage comparator 48 can check whether the voltage is pulled down to below the reference voltage. If the voltage is below the reference voltage, the first voltage comparator 48 will output 1 to indicate an overcurrent.

Figure 6:
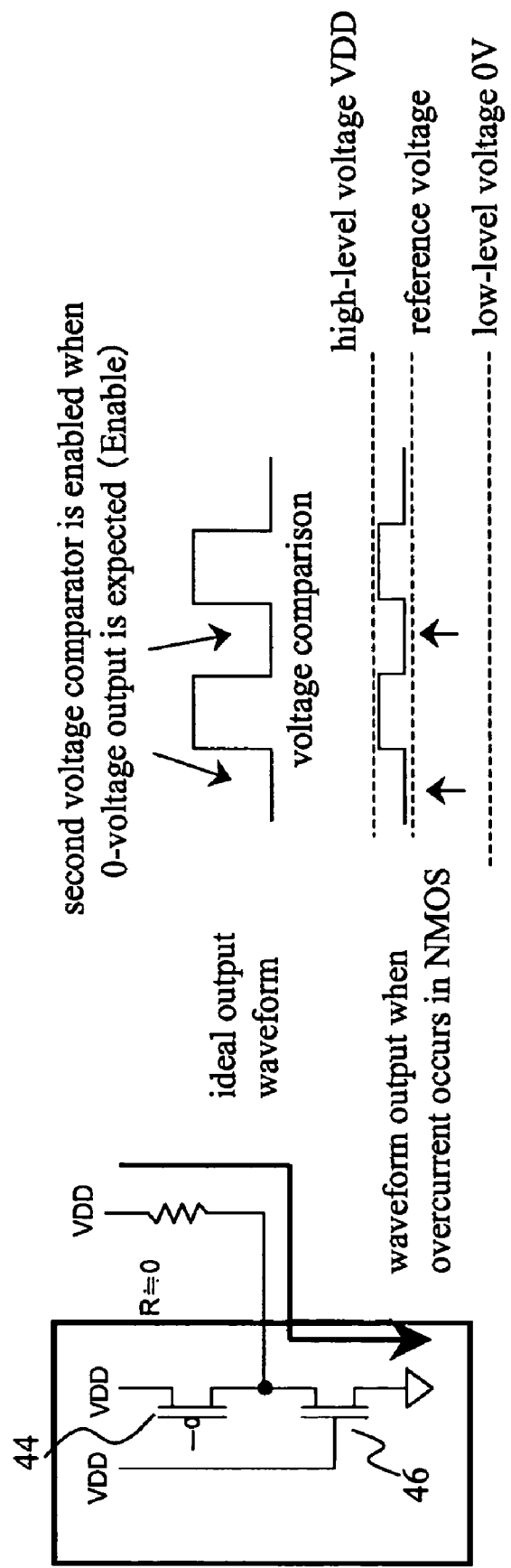
FIG. 6 is a diagram schematically showing that a second voltage comparator detects an overcurrent according to the present invention.

Refer to FIG. 6 for the overcurrent protection of the NMOS transistor 46. When CMOS driver output stage is expected to output 0, the second voltage comparator 50 begins to operate, and the clock logic module 42 sends an enable signal to the second voltage comparator 50. When CMOS driver output stage is expected to output 1, the second voltage comparator 50 will not operate. The second voltage comparator 50 can check whether the voltage is pulled upward to over the reference voltage. If the voltage is over the reference voltage, the second voltage comparator 50 will output 1 to indicate an overcurrent.

When the output of the power amplifier shifts from 1 to 0 or from 0 to 1, the power source is likely to have voltage bounce, which may result in instantaneous instability of the power source and may cause the comparator to malfunction. The digital voltage debounce device 54 allows only a longer interval of logic "1" signal to pass but eliminates an instantaneous logical "1" signal lest malfunction occur, wherein the instantaneous logical "1" signal is referred to a logical "1" signal having a length of from 100 to 300 ns. After passing through the digital voltage debounce device 5, the long interval of logic "1" signal, which is originally output by the voltage comparator, is still a "1"-level signal. At this time, the overcurrent protection module 56 turns off the output-stage transistors 44 and 46 to stop high current.

In conclusion, the present invention proposes a voltage detection type overcurrent protection device to protect the high-current rear-stage driver from overcurrent. The present invention outputs the same signal as a PWM system does and thus may function as a protection device of a general PWM system. The present invention can be realized with an integrated circuit more simply and space-efficiently and will operate more power-efficiently.

The preferred embodiments described above are only to exemplify the present invention but not to limit the scope of the present invention. Therefore, any equivalent modification or variation according to the spirit of the present invention is to be also included within the scope of the present invention.

What is claimed is:

1. A voltage detection type overcurrent protection device for a Class-D amplifier, comprising:

a clock logic module, connected to a PWM (Pulse Width Modulation) module and receiving a PWM signal;

a CMOS (Complementary Metal Oxide Semiconductor) digital power amplifier, including a PMOS (P-channel MOS) transistor and an NMOS transistor, which are capable of driving a high load, wherein gates of said PMOS and NMOS (N-channel MOS) are respectively connected to said clock logic module;

a first voltage comparator and a second voltage comparator, respectively connected to an output terminal of said CMOS digital power amplifier;

a reference voltage circuit, setting two reference voltages respectively for said first voltage comparator and said second voltage comparator, wherein said reference voltages are derived from critical current values for overcurrent protection;

a digital voltage debounce device with input terminals thereof respectively connected to output terminals of said first voltage comparator and said second voltage comparator;

an overcurrent protection module with input terminals thereof connected to said digital voltage debounce device and an output terminal thereof connected to said clock logic module; and the overcurrent protection module receives a signal from said digital voltage debounce device, when said signal is 1, said overcurrent protection module sends a high-impedance instruction to said clock logic module to compulsorily turn off said PMOS transistor and said NMOS transistor.

2. The voltage detection type overcurrent protection device for a Class-D amplifier according to claim 1, wherein when said CMOS digital power amplifier output a "1" signal, said clock logic module enables said first voltage comparator to check whether an output value of said CMOS digital power amplifier is below said reference value of said first voltage comparator; if said output value is below said reference value of said first voltage comparator, said first voltage comparator outputs a "1" signal; when said CMOS digital power amplifier output a "0" signal, said clock logic module turns off said first voltage comparator.

3. The voltage detection type overcurrent protection device for a Class-D amplifier according to claim 1, wherein when said CMOS digital power amplifier output a "0" signal, said clock logic module enables said second voltage comparator to check whether an output value said CMOS digital power amplifier is over said reference value of said second voltage comparator; if said output value is over said reference value of said second voltage comparator, said second voltage comparator outputs a "1" signal; when said CMOS digital power amplifier should output a "1" signal, said clock logic module turns off said second voltage comparator.

4. The voltage detection type overcurrent protection device for a Class-D amplifier according to claim 1, wherein output terminals of said first voltage comparator and said second voltage comparator are connected to said digital voltage debounce device; said digital voltage debounce device allows only a longer interval of logic "1" signal to pass but eliminates an instantaneous logical "1" signal.

5. The voltage detection type overcurrent protection device for a Class D amplifier according to claim 1, which outputs same signal as a PWM system does and functions as a protection device of a general PMW system.

* * * * *